(12) United States Patent
Wang

(10) Patent No.: US 11,854,915 B2
(45) Date of Patent: Dec. 26, 2023

(54) ELECTRICAL TEST STRUCTURE, SEMICONDUCTOR STRUCTURE AND ELECTRICAL TEST METHOD

(71) Applicant: CHANGXIN MEMORY TECHNOLOGIES, INC., Hefei (CN)

(72) Inventor: Hai Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 155 days.

(21) Appl. No.: 17/453,205

(22) Filed: Nov. 2, 2021

(65) Prior Publication Data

US 2023/0008748 A1   Jan. 12, 2023

Related U.S. Application Data

(63) Continuation of application No. PCT/CN2021/107173, filed on Jul. 19, 2021.

(30) Foreign Application Priority Data

Jul. 9, 2021   (CN) .......................... 202110780255.4

(51) Int. Cl.
*G01R 31/26* (2020.01)
*H01L 21/66* (2006.01)

(52) U.S. Cl.
CPC .......... *H01L 22/34* (2013.01); *G01R 31/2601* (2013.01)

(58) Field of Classification Search
CPC .................. G01R 31/2601; G01R 31/26; G01R 31/2805; G01R 31/2806; G01R 31/2818;
(Continued)

(56) References Cited

U.S. PATENT DOCUMENTS 5,066,908 A * 11/1991 Takahashi ............... H01L 22/12
324/73.1
2010/0019789 A1   1/2010 Lorenz et al.
2012/0125666 A1   5/2012 Klamminger et al.

FOREIGN PATENT DOCUMENTS

CN         101133689 A      2/2008
CN         104517937 A  *   4/2015  ........... H01L 23/544
(Continued)

OTHER PUBLICATIONS

Translate CN 104517937 A "A Testing Structure and Its Forming Method and Testing Method" (Year: 2015).*
(Continued)

*Primary Examiner* — Jermele M Hollington
*Assistant Examiner* — Courtney G McDonnough
(74) *Attorney, Agent, or Firm* — Cooper Legal Group, LLC

(57) ABSTRACT

The present disclosure provides an electrical test structure, a semiconductor structure and an electrical test method. In the electrical test structure, in a first direction, the electrical test structure includes a first layer, an interconnect hole and a second layer arranged in a stack, and the interconnect hole is in contact with the first layer; the second layer includes a body part and a test part, and the test part is connected to the body part; the interconnect hole is configured as, when an offset distance of the interconnect hole relative to a preset position in a second direction is less than a first preset distance, or an offset distance of the interconnect hole relative to the preset position in a third direction is less than a second preset distance, the interconnect hole is spaced apart from the test part.

15 Claims, 5 Drawing Sheets

(58) Field of Classification Search
CPC ......... H01L 22/14; H01L 22/34; H01L 21/66; H05K 1/0268; H05K 2201/09781; H05K 3/429; H05K 3/4638; H05K 2203/166; H05K 3/46
USPC .................................................. 324/762.03
See application file for complete search history.

(56) References Cited

FOREIGN PATENT DOCUMENTS

| | | |
|---|---|---|
| CN | 104517937 A | 4/2015 |
| CN | 102097348 B | 8/2016 |
| CN | 111707185 | 9/2020 |
| JP | H02246194 A | 10/1990 |
| JP | H0729952 A | 1/1995 |
| JP | H11145628 A | 5/1999 |

OTHER PUBLICATIONS

International Search Report cited in PCT/CN2021/107173, dated Mar. 28, 2022, 9 pages.

\* cited by examiner

ELECTRICAL TEST STRUCTURE, SEMICONDUCTOR STRUCTURE AND ELECTRICAL TEST METHOD

CROSS-REFERENCE TO RELATED APPLICATIONS

This is a continuation of International Application No. PCT/CN2021/107173, filed on Jul. 19, 2021, which claims the priority to Chinese Patent Application 202110780255.4, titled "ELECTRICAL TEST STRUCTURE, SEMICONDUCTOR STRUCTURE AND ELECTRICAL TEST METHOD" and filed on Jul. 9, 2021. The entire contents of International Application No. PCT/CN2021/107173 and Chinese Patent Application 202110780255.4 are incorporated herein by reference.

TECHNICAL FIELD

The present disclosure relates to the field of electrical test structure, a semiconductor structure and an electrical test method.

BACKGROUND

With the progress of technology, the requirements for the manufacturing process of integrated circuits are increasing, and because the manufacturing cycle of integrated circuits is long and the cost is high, it is particularly important to improve the manufacturing efficiency and quality of the manufacturing process. During the manufacturing of an integrated circuit, the industry usually manufactures WAT (Wafer Acceptance Test) structures on the circumference of each integrated circuit chip of a wafer, and then inspects the WAT structures to test the corresponding manufacturing process.

SUMMARY

The subject matter is described in detail herein below, which is not intended to limit the scope of protection of claims.

The present disclosure provides an electrical test structure, a semiconductor structure and an electrical test method.

The first aspect of the present disclosure provides an electrical test structure for a semiconductor structure, in a first direction, the electrical test structure includes a first layer, an interconnect hole and a second layer arranged in a stack, the interconnect hole is located between the first layer and the second layer, and the interconnect hole is in contact with the first layer;

the second layer includes a body part and a test part, and the test part is connected to the body part;

the interconnect hole is configured as, when an offset distance of the interconnect hole relative to a preset position in a second direction is less than a first preset distance, or an offset distance of the interconnect hole relative to the preset position in a third direction is less than a second preset distance, the interconnect hole is spaced apart from the test part;

when the offset distance of the interconnect hole relative to the preset position in the second direction is greater than or equal to the first preset distance, and/or the offset distance of the interconnect hole relative to the preset position in the third direction is greater than or equal to the second preset distance, the interconnect hole is in contact with the test part;

the preset position is fixed relative to the second layer, and the first direction, the second direction and the third direction are perpendicular to each other.

The second aspect of the present disclosure provides a semiconductor structure, including an oxide layer, and a first layer, a second layer and an interconnect hole of the electrical test structure as described in the first aspect, wherein the second layer is located inside the oxide layer.

The third aspect of the present disclosure provides an electrical test method, applied to the electrical test structure as described in the first aspect, a second layer of the electrical test structure being grounded, the electrical test method including:

applying a voltage to a first layer of the electrical test structure;

detecting a present current value of the first layer; and determining alignment of an interconnect hole of the electrical test structure based on the present current value.

After the drawings and detailed description are read and understood, other aspects may be understood.

BRIEF DESCRIPTION OF THE DRAWINGS

The drawings, which are incorporated in and constitute a part of the specification, illustrate embodiments of the present disclosure and together with the description serve to explain the principles of the embodiments of the present disclosure. In these drawings, similar reference numerals are used for representing similar elements. The drawings in the following description are only some rather than all of the embodiments of the present disclosure. Those skilled in the art would be able to derive other drawings from these drawings without any creative efforts.

REFERENCE NUMERALS

1: first layer; 2: second layer; 21: test part; 211: first test unit; 212: second test unit; 2121: first half unit; 2122: second half unit; 213: third test unit; 214: support unit; 22: body part; 23: square hole; 3: interconnect hole; 4: first pad; 5: second pad; 20: oxide layer; 30: substrate.

DETAILED DESCRIPTION

A clear and complete description will be made to the technical solutions in the embodiments of the present disclosure below in combination with the drawings in the embodiments of the present disclosure. Apparently, the embodiments described are part of the embodiments of the present disclosure, not all of them. All other embodiments obtained by those skilled in the art based on the embodiments of the present disclosure without any creative efforts shall fall within the protection scope of the present disclosure. It should be noted that the embodiments in the present disclosure and the features in the embodiments can be combined with each other on a non-conflict basis.

A semiconductor structure requires an interconnect hole (contact) for the leading-out of a device. The interconnect hole is a connect part between different layers. Therefore, the alignment of the interconnect hole is very important for the semiconductor structure.

WAT structures are generally divided into two types. One is kelvin four-terminal test structure, and the other is chain test structure. However, the two structures cannot monitor the alignment of the interconnect hole well.

The present disclosure provides an electrical test structure of a semiconductor structure. In the electrical test structure, when the offset distances of an interconnect hole relative to a preset position in a second direction and a third direction are relatively short, it indicates that the interconnect hole is aligned and the interconnect hole is spaced apart from a test part; when the offset distances of the interconnect hole relative to the preset position in the second direction and/or the third direction are relatively long, it indicates that the interconnect hole is not aligned and the interconnect hole is in contact with the test part; as such, the alignment of the interconnect hole can be determined by detecting whether the first layer, the interconnect hole and the second layer form a circuit path. The electrical test structure has a simple structure, the method for detecting the alignment of the interconnect hole is easy to operate, and the detection result is reliable.

Figure 1:
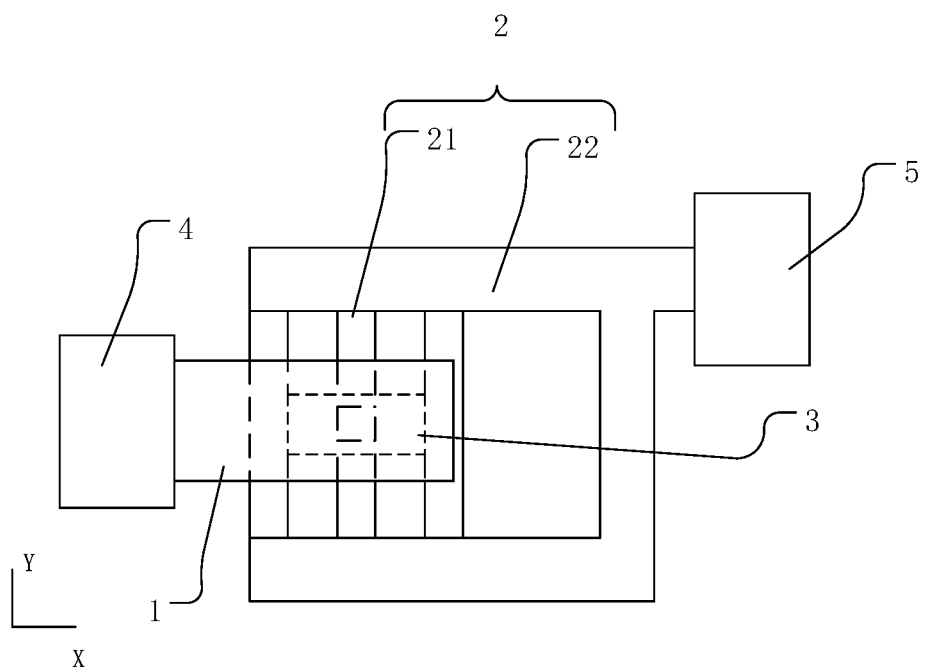
FIG. 1 is a perspective schematic diagram of an electrical test structure according to an exemplary embodiment.
Figure 2:
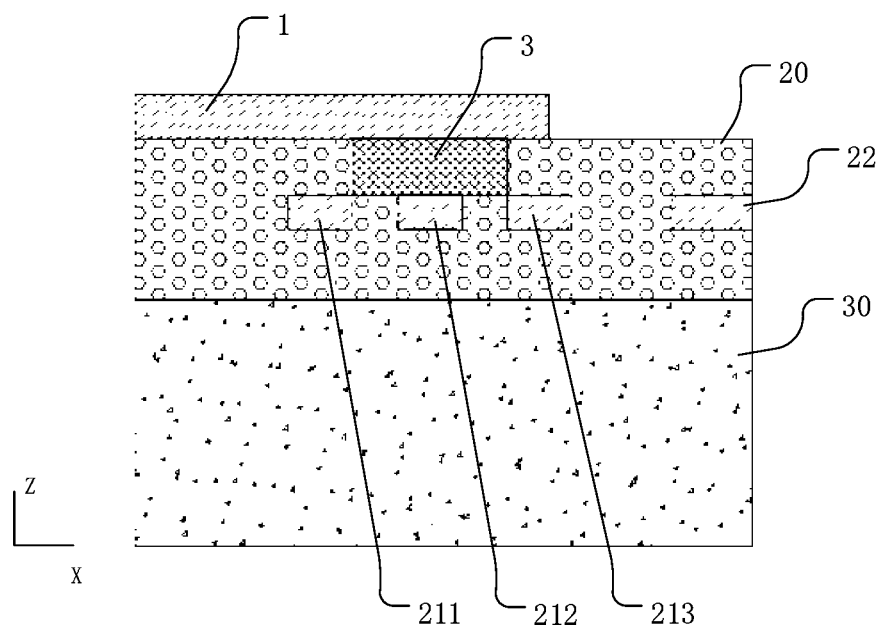
FIG. 2 is a cross-sectional view of a semiconductor structure according to an exemplary embodiment.
Figure 3:
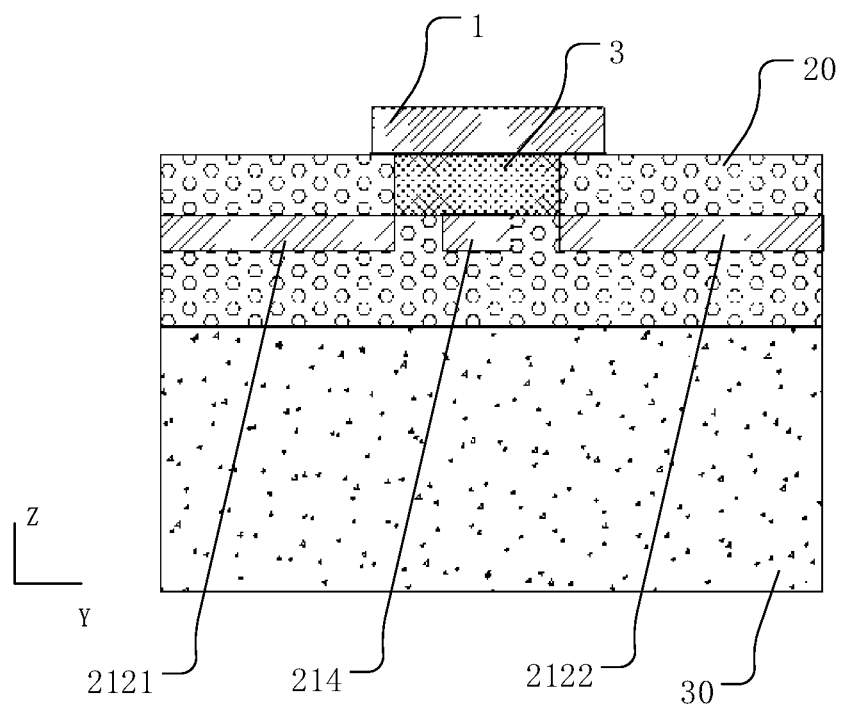
FIG. 3 is a cross-sectional view of a semiconductor structure according to an exemplary embodiment.
Figure 4:
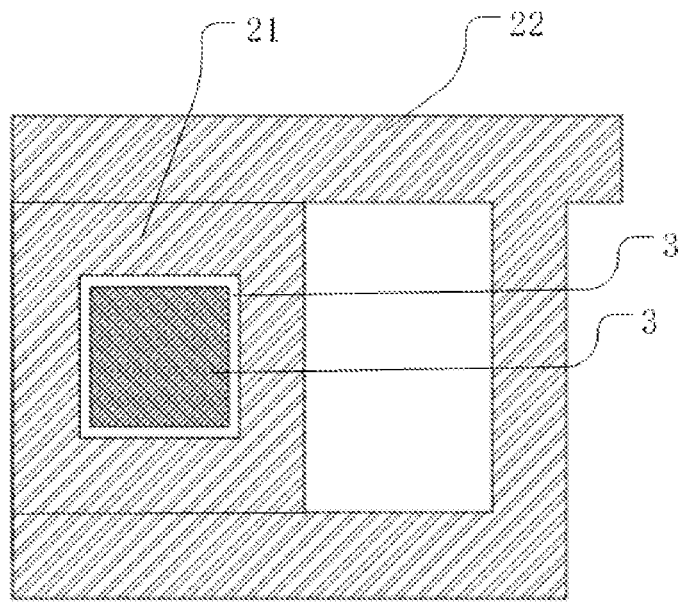
FIG. 4 is a cross-sectional view of an electrical test structure according to an example.

In an exemplary embodiment, an electrical test structure of a semiconductor structure is provided. Referring to FIGS. 1 to 3, in a first direction, the electrical test structure includes a first layer 1, an interconnect hole 3 and a second layer 2 arranged in a stack, wherein the first layer 1 may be a metal layer, the material of the metal layer may be tungsten, copper or aluminum, and the second layer 2 may be a polysilicon layer or a diffusion layer. The first direction is, for example, the Z direction in FIGS. 2 and 3.

In the electrical test structure, the interconnect hole 3 is located between the first layer 1 and the second layer 2, and the interconnect hole 3 is in contact with the first layer 1. The interconnect hole 3 may also be referred to as a contact hole, and is not a through hole in the traditional sense, but a physical structure including a conductive material. During the manufacturing of the semiconductor structure, the interconnect hole 3 is formed by first setting a hole structure and then filling a conductive material to form a conductive plug structure, which is generally referred to as the interconnect hole 3 or contact hole, wherein the conductive material may be, for example, a metal material.

In the electrical test structure, the second layer 2 includes a body part 22 and a test part 21, and the test part 21 is connected to the body part 22. The test part 21 and the body part 22 may be integrally formed or split. That is, the types of materials included in the test part 21 and the body part 22 may be the same or different.

The interconnect hole 3 is configured as, when the offset distance of the interconnect hole 3 relative to a preset position in a second direction is less than a first preset distance, or the offset distance of the interconnect hole 3 relative to the preset position in a third direction is less than a second preset distance, the interconnect hole 3 is aligned and the interconnect hole 3 is spaced apart from the test part 21. The second direction is, for example, the X direction in FIG. 1, and the third direction is, for example, the Y direction in FIG. 1.

The interconnect hole 3 is further configured as, when the offset distance of the interconnect hole 3 in the second direction relative to the preset position is greater than or equal to the first preset distance, and/or the offset distance of the interconnect hole 3 relative to the preset position in the third direction is greater than or equal to the second preset distance, the interconnect hole 3 is not aligned and the interconnect hole 3 is in contact with the test part 21.

The first preset distance and the second preset distance may be zero, or may be a distance within an allowable error range, and the distance may be, for example, 3 micrometers.

The first preset distance and the second preset distance may be the same. For example, the both are zero or 2 microns.

The first preset distance and the second preset distance may also be different. For example, the first preset distance is zero, and the second preset distance is 3 microns. For another example, the first preset distance is 2 microns, and the second preset distance is 3 microns.

Referring to FIGS. 1 to 3, in the electrical test structure, the first direction, the second direction and the third direction are perpendicular to each other. In addition, the preset position is fixed relative to the second layer 2. For example, the position of the second layer 2 may be used as the preset position, or any fixed position in the second layer 2 may be used as the preset position.

In this electrical test structure, if the interconnect hole 3 is aligned, the first layer 1, the interconnect hole 3 and the second layer 2 will not form a conductive path. If the interconnect hole 3 is not aligned, for example, the interconnect hole 3 is offset by a sufficient distance in the second direction and/or the third direction, the first layer 1, the interconnect hole 3 and the second layer 2 form a conductive path. Therefore, by detecting the current in the electrical test structure, it can be determined whether the interconnect hole 3 is aligned.

The electrical test structure is a new WAT structure, and is simple. By detecting the current in the electrical test structure, it can be determined whether the interconnect hole is aligned, so the operation is convenient, and the result is reliable.

In an exemplary embodiment, an electrical test structure is provided. Referring to FIGS. 1 to 3, in the electrical test structure, the interconnect hole 3 is constructed as a rectangular parallelepiped to facilitate the arrangement of the interconnect hole 3.

In the first direction, the size of the interconnect hole 3 is equal to the spacing size between the first layer 1 and the second layer 2 to better ensure that, when the interconnect hole 3 is not aligned, the interconnect hole 3 is in contact with both the first layer 1 and the second layer 2.

EXAMPLE

Referring to FIGS. 1 to 4, a square hole 23 is formed in the middle of the test part 21. The square hole 23 may be a rectangular hole or a square hole. When the rectangular interconnect hole 3 is aligned, the position of the interconnect hole 3 corresponds to the position of the square hole 23.

Both the first preset distance and the second preset distance may be 3 micrometers, and the preset position is the center of the square hole 23. The size of the square hole 23 in the second direction is 6 microns larger than that of the interconnect hole 3 in the second direction, and the size of the square hole 23 in the third direction is also 6 microns larger than that of the interconnect hole 3 in the third direction.

When the interconnect hole 3 is aligned, the offset distance of the interconnect hole 3 relative to the center of the rectangular hole 23 in the second direction is less than 3 microns, that is, the offset distance of the interconnect hole 3 relative to the center of the rectangular hole 23 in the second direction is less than the first preset distance, and the offset distance of the interconnect hole 3 relative to the center of the square hole 23 in the third direction is also less than 3 microns, that is, the offset distance of the interconnect hole 3 relative to the center of the square hole 23 in the third direction is less than the second preset distance. At this time, the interconnect hole 3 is not in contact with the test part 21, and the first layer 1, the interconnect hole 3 and the second layer 2 cannot form a conductive path.

When the interconnect hole 3 is not aligned, the offset distance of the interconnect hole 3 relative to the center of the square hole 23 in the second direction is greater than or equal to 3 microns, or the offset distance of the interconnect hole 3 relative to the center of the square hole 23 in the third direction is greater than or equal to 3 microns, or the offset distances of the interconnect hole 3 relative to the center of the square hole 23 in both the second direction and the third direction are greater than or equal to 3 microns. At this time, since the size of the interconnect hole 3 is equal to the spacing size between the first layer 1 and the second layer 2 in the first direction, the interconnect hole 3 is in contact with the test part 21, and the first layer 1, the interconnect hole 3 and the second layer 2 can form a conductive path.

In the electrical test structure, the interconnect hole is constructed as a rectangular parallelepiped, which provides convenience for the manufacturing process of the interconnect hole, facilitates the size design of the interconnect hole, and can better detect the alignment of the interconnect hole and improve the accuracy of the test result.

In an exemplary embodiment, an electrical test structure is provided. Referring to FIGS. 1 to 3, in the electrical test structure, the test part 21 includes a first test unit 211 and a third test unit 213 that are connected to the body part 22, and both the first test unit 211 and the third test unit 213 extend in the second direction.

In the third direction, the first test unit 211 and the third test unit 213 are spaced apart, and the interconnect hole 3 is located between the first test unit 211 and the third test unit 213.

In the electrical test structure, the interconnect hole 3 is configured as, when the offset distance of the interconnect hole 3 relative to the preset position in the third direction is less than the preset distance, the interconnect hole 3 is spaced apart from the first test unit 211 and the third test unit 213; when the offset distance of the interconnect hole 3 relative to the preset position in the third direction is greater than or equal to the preset distance, the interconnect hole 3 is in contact with the first test unit 211, or the interconnect hole 3 is in contact with the third test unit 213.

When the offset distance of the interconnect hole 3 close to the first test unit 211 in the third direction is greater than or equal to the preset distance, the interconnect hole 3 is in contact with the first test unit 211. For example, referring to FIG. 6, the dashed box in FIG. 6 indicates the position of the interconnect hole 3 after the offset. At this time, the first layer 1, the interconnect hole 3, the first test unit 211 and the body part 22 can form a conductive path. When the offset distance of the interconnect hole 3 close to the third test unit 213 in the third direction is greater than or equal to the preset distance, the interconnect hole 3 is in contact with the third test unit 213. For example, referring to FIG. 7, the dashed box in FIG. 7 indicates the position of the interconnect hole 3 after the offset. At this time, the first layer 1, the interconnect hole 3, the third test unit 213 and the body part 22 can form a conductive path.

In the electrical test structure, if the offset distance of the interconnect hole 3 in the third direction is greater than or equal to the preset distance, the first layer 1, the interconnect hole 3 and the second layer 2 can form a conductive path. Thus, the alignment of the interconnect hole 3 can be determined by detecting whether there is current in the first layer 1, the second layer 2 or the interconnect hole 3, which is simple and reliable.

The shapes and/or sizes of the first test unit 211 and the third test unit 213 may be different or the same.

When the shapes and sizes of the first test unit 211 and the third test unit 213 are the same, it is more convenient to manufacture the first test unit 211 and the third test unit 213 and manufacture the semiconductor structure, which can improve the manufacturing efficiency to a certain extent.

When the shapes or sizes of the first test unit 211 and the third test unit 213 are different, the resistances of the first test unit 211 and the third test unit 213 are different. In this case, it can be determined based on the magnitude of the detected current whether the interconnect hole 3 is in contact with the first test unit 211 or the third test unit 213, so that the offset direction of the interconnect hole 3 can be determined for learning the alignment of the interconnect hole 3 more accurately.

It should be noted that the different resistances of the first test unit 211 and the third test unit 213 may also be realized by setting different materials.

In an exemplary embodiment, an electrical test structure is provided. Referring to FIGS. 1 to 3, in the electrical test structure, the interconnect hole 3 may be constructed as a rectangular parallelepiped. In the third direction, the size of the interconnect hole 3 may be equal to the spacing size between the first test unit 211 and the third test unit 213. In this case, the second preset distance is zero.

In this electrical test structure, as long as the interconnect hole 3 is offset in the third direction, the interconnect hole 3 can be in contact with the first test unit 211 or the third test unit 213, and the first layer 1, the interconnect hole 3 and the second layer 2 can realize a conductive path, which facilitates more accurate detection of the alignment of the interconnect hole 3 to better ensure the alignment of the interconnect hole 3.

Figure 5:
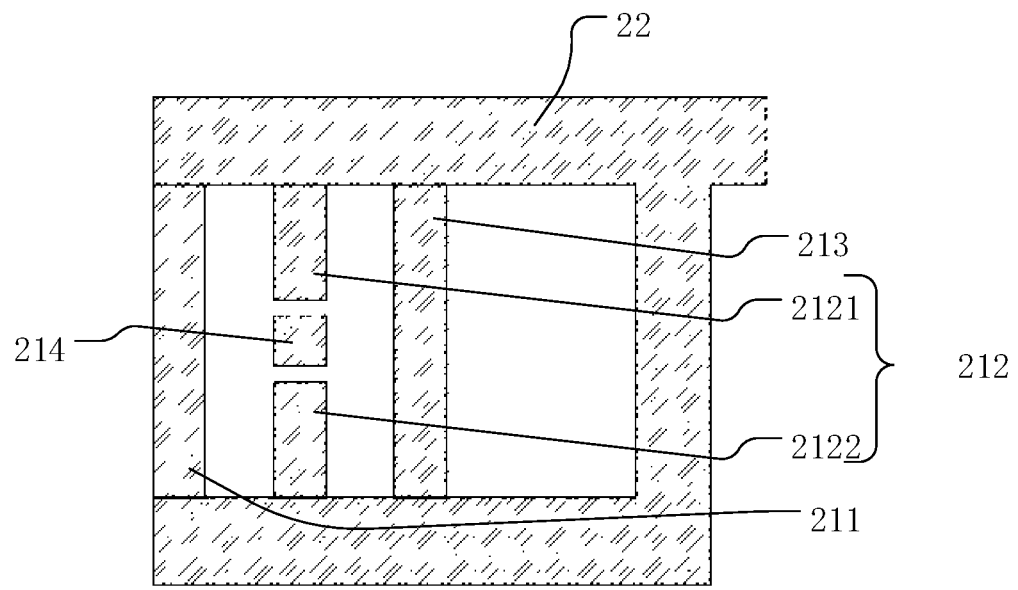
FIG. 5 is a cross-sectional view of an electrical test structure according to an example.

In an exemplary embodiment, an electrical test structure is provided. Referring to FIGS. 1 and 5, in the electrical test structure, the test part 21 may further include a second test unit 212 connected to the body part 22, and the extension direction of the second test unit 212 is the same as that of the first test unit 211, that is, the second test unit 212 also extends in the second direction, which facilitates the overall arrangement of the first test unit 211, the second test unit 212 and the third test unit 213.

In the third direction, the second test unit 212 is located between the first test unit 211 and the third test unit 213, and the spacing size between the first test unit 211 and the second test unit 212 is equal to the spacing size between the second test unit 212 and the third test unit 213. That is, the first test unit 211, the second test unit 212 and the third test unit 213 are arranged at equal intervals to ensure the overall structural stability of the second layer 2.

Referring to FIGS. 1, 3 and 5, the second test unit 212 may include a first half unit 2121 and a second half unit 2122. Moreover, in the second direction, the first half unit 2121 and the second half unit 2122 are spaced apart, and the interconnect hole 3 is located between the first half unit 2121 and the second half unit 2122. That is, when the interconnect hole 3 is aligned, the interconnect hole 3 is not in contact with both the first half unit 2121 and the second half unit 2122.

In the electrical test structure, the interconnect hole 3 may be configured as, when the offset distance of the interconnect hole 3 relative to the preset position in the second direction is less than the first preset distance, the interconnect hole 3 is aligned, the interconnect hole 3 is spaced apart from the first half unit 2121, and the interconnect hole 3 is spaced apart from the second half unit 2122.

Figure 8:
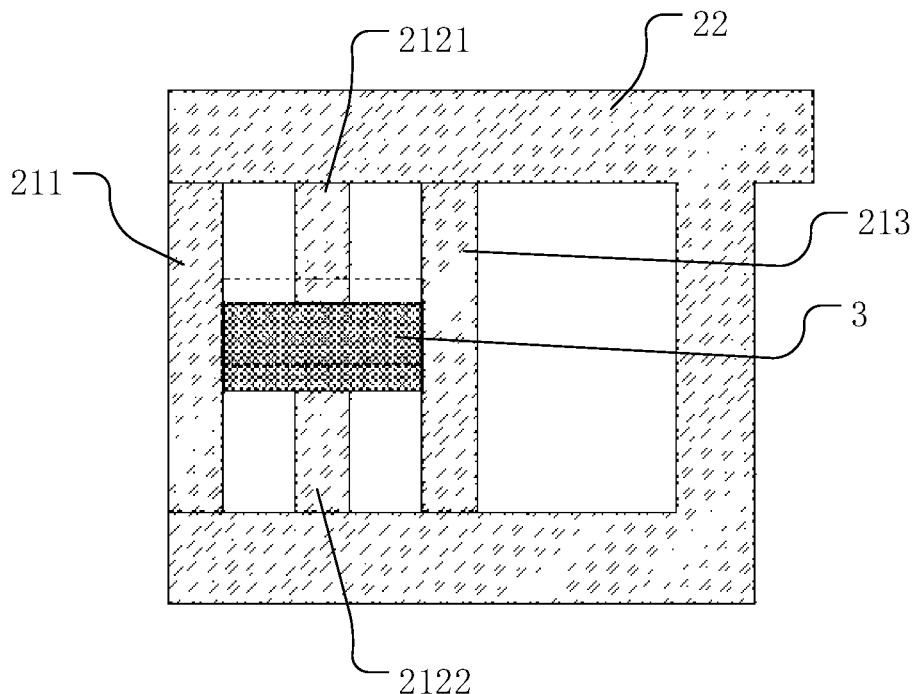
FIG. 8 is a cross-sectional view of an electrical test structure according to an example.
Figure 9:
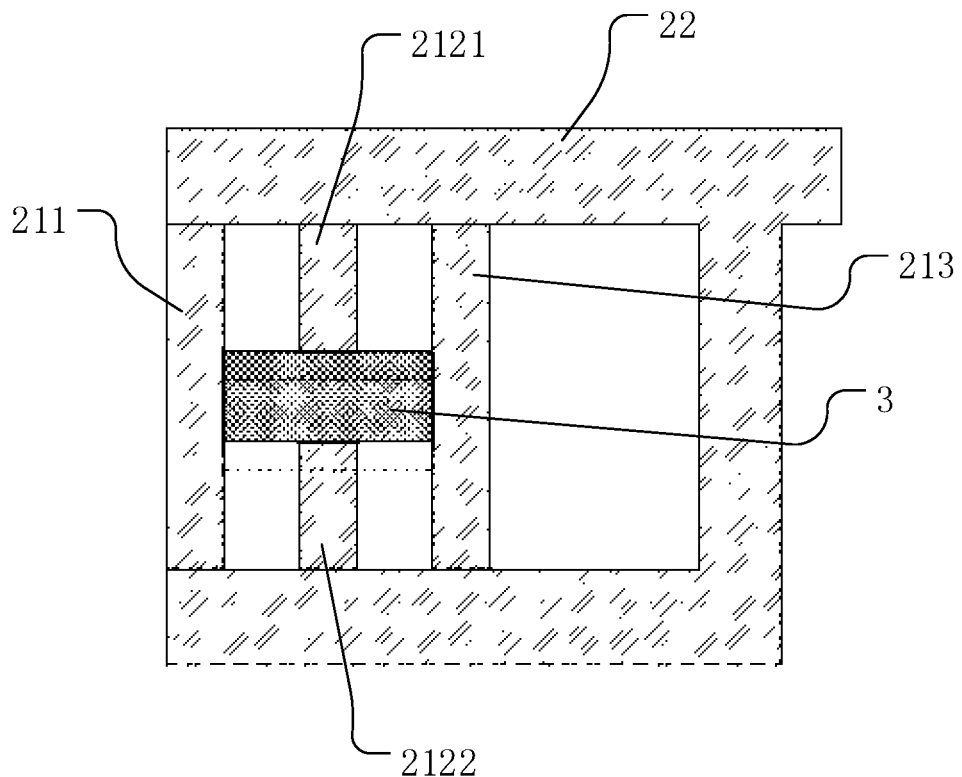
FIG. 9 is a cross-sectional view of an electrical test structure according to an example.

The interconnect hole 3 may also be configured as, when the offset distance of the interconnect hole 3 relative to the preset position in the second direction is greater than or equal to the first preset distance, the interconnect hole 3 is not aligned, and the interconnect hole 3 is in contact with the first half unit 2121, or the interconnect hole 3 is in contact with the second half unit 2122. When the offset distance of the interconnect hole 3 close to the first half unit 2121 is greater than or equal to the first preset distance, the interconnect hole 3 is in contact with the first half unit 2121, for example, as shown in FIG. 8, the dashed box in FIG. 8 indicates the position of the interconnect hole 3 after the offset; when the offset distance of the interconnect hole 3 close to the second half unit 2122 is greater than or equal to the first preset distance, the interconnect hole 3 is in contact with the second half unit 2122, for example, as shown in FIG. 9, the dashed box in FIG. 9 indicates the position of the interconnect hole 3 after the offset.

In this electrical test structure, if the interconnect hole 3 is aligned in the second direction, the interconnect hole 3 will not be in contact with the first half unit 2121 or the second half unit 2122, and the first layer 1, the interconnect hole 3 and the second test unit 212 will not form a conductive path. If the interconnect hole 3 is not aligned in the second direction, the interconnect hole 3 will be in contact with the first half unit 2121 or the second half unit 2122, and the first layer 1, the interconnect hole 3 and the second test unit 212 can form a conductive path.

The shapes and/or sizes of the first half unit 2121 and the second half unit 2122 may be different or the same.

When the shapes and sizes of the first half unit 2121 and the second half unit 2122 are the same, it is more convenient to manufacture the first half unit 2121 and the second half unit 2122 and manufacture the second test unit 212, which can improve the manufacturing efficiency to a certain extent.

When the shapes or sizes of the first half unit 2121 and the second half unit 2122 are different, the resistances of the first half unit 2121 and the second half unit 2122 are different. In this case, it can be determined based on the magnitude of the detected current whether the interconnect hole 3 is in contact with the first half unit 2121 or the second half unit 2122, so that the offset direction of the interconnect hole 3 can be determined for learning the alignment of the interconnect hole 3 more accurately.

It should be noted that the different resistances of the first half unit 2121 and the third half unit may also be realized by setting different materials.

In addition, in the electrical test structure, when the resistances of the first test unit 211, the third test unit 213, the first half unit 2121 and the second half unit 2122 are all different from each other, and when the interconnect hole 3 is not aligned, the specific structure in contact with the interconnect hole 3 in the second layer 2 can be determined based on the magnitude of the detected current, so that the offset direction of the interconnect hole 3 can be determined for learning the alignment of the interconnect hole 3 more accurately.

In an exemplary embodiment, an electrical test structure is provided. Referring to FIGS. 1, 3 and 5, in the electrical test structure, the interconnect hole 3 may be constructed as a rectangular parallelepiped. In the second direction, the size of the interconnect hole 3 is equal to the spacing size between the first half unit 2121 and the second half unit 2122. In this case, the first preset distance is zero.

In this electrical test structure, as long as the interconnect hole 3 is offset in the second direction, the interconnect hole 3 can be in contact with the first half unit 2121 or the second half unit 2122, and the first layer 1, the interconnect hole 3 and the second test unit 212 can realize a conductive path, which facilitates more accurate detection of the alignment of the interconnect hole 3 to better ensure the alignment of the interconnect hole 3.

In an exemplary embodiment, an electrical test structure is provided. Referring to FIGS. 1 to 3 and 5, in the electrical test structure, the second layer 2 may further include a support unit 214. In the second direction, the support unit 214 is located between the first half unit 2121 and the second half unit 2122.

The interconnect hole 3 is located between the first layer 1 and the support unit 214, and the support unit 214 is in contact with the interconnect hole 3 to support the interconnect hole 3, which facilitates the manufacturing of the interconnect hole 3.

In the electrical test structure, the preset position may be the position where the interconnect hole 3 is located when the line connecting the geometric center of the interconnect hole 3 with the geometric center of the support unit 214 extends in the first direction. That is, the distance between the preset position and the first half unit 2121 and the distance between the preset position and the second half unit 2122 are both the first preset distance, and the distance between the preset position and the first test unit 211 and the distance between the preset position and the third test unit 213 are both the second preset distance.

When the shapes and sizes of the first test unit 211 and the second test unit 212 are the same, and the shapes and sizes of the first half unit 2121 and the second half unit 2122 are the same, the cross-sectional size of the first test unit 211 perpendicular to the second direction is the same as that of the second test unit 212 perpendicular to the second direction, and when the first preset distance and the second preset distance are also the same, the line connecting the geometric center of the interconnect hole 3 with the geometric center of the overall structure formed by the first test unit 211, the second test unit 212 and the third test unit 213 extends in the first direction, that is, the line connecting the geometric center of the interconnect hole 3 with the geometric center of the test part 21 extends in the first direction, and the preset position may be any position in the connecting line.

Example

Referring to FIGS. 1-3 and 5-9, the electrical test structure includes a first layer 1, an interconnect hole 3 and a second layer 2 arranged in a stack in a first direction. The interconnect hole 3 is in contact with the first layer 1.

The second layer 2 includes three strip structures, which are respectively denoted as a first strip, a second strip and a third strip. The first strip is equivalent to the first test unit 211, and the third strip is equivalent to the third test unit 213.

The second strip is discontinuous, and the second strip is divided into a first half strip, a second half strip, and a middle block located between the first half strip and the second half strip in its extension direction. The extension direction of the second strip is the second direction, the first half strip is equivalent to the first half unit 2121, the second half strip is equivalent to the second half unit 2122, and the middle block is equivalent to the support unit 214.

The interconnect hole 3 is constructed as a rectangular parallelepiped. The height of the rectangular parallelepiped is the same as the spacing size between the first layer 1 and the second layer 2, the length of the rectangular parallelepiped is the same as the spacing size between the first strip and the second strip, and the width of the rectangular parallelepiped is the same as the spacing size between the first half strip and the second half strip. The height of the rectangular parallelepiped is the dimension in the first direction, the length of the rectangular parallelepiped is the dimension in the third direction, and the width of the rectangular parallelepiped is the dimension in the second direction.

If the interconnect hole 3 is aligned, the contact hole is not in contact with the second layer 2.

Figure 6:
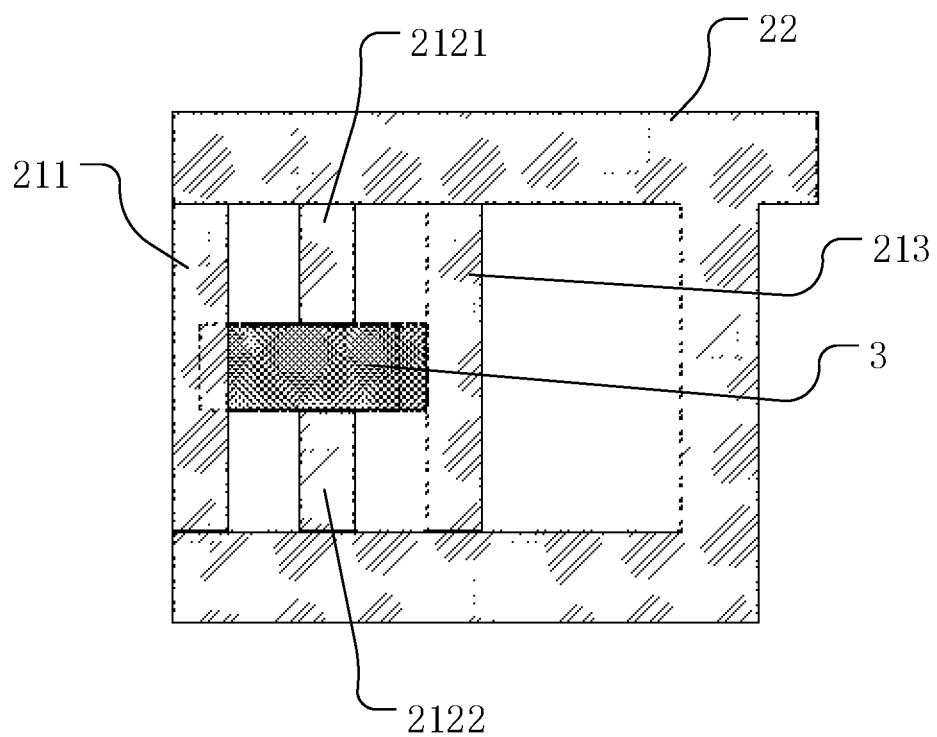
FIG. 6 is a cross-sectional view of an electrical test structure according to an example.
Figure 7:
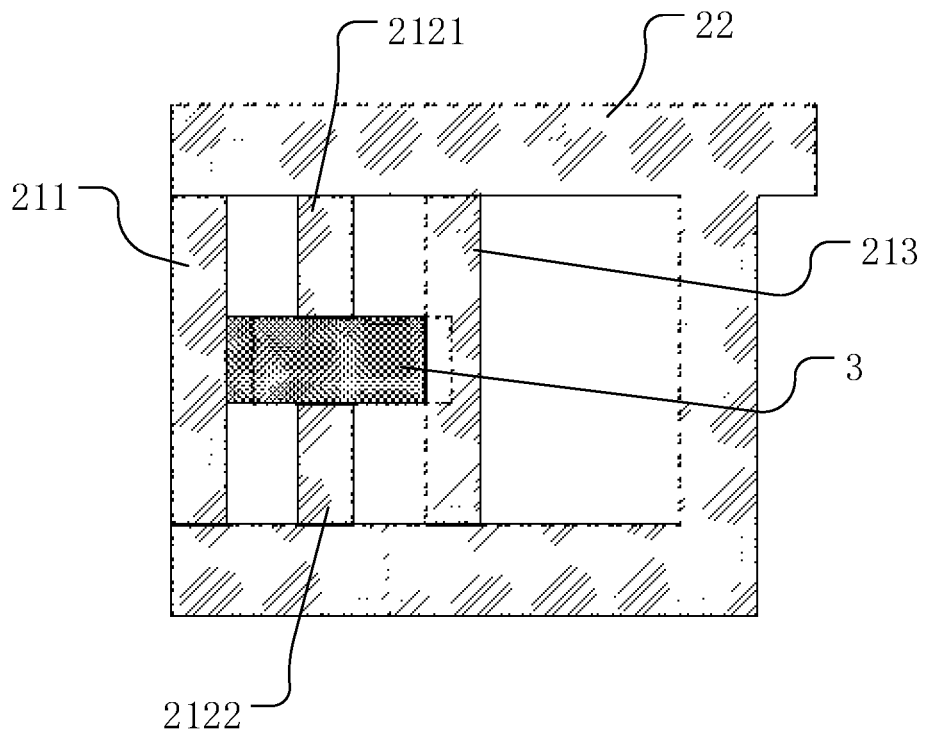
FIG. 7 is a cross-sectional view of an electrical test structure according to an example.

If the interconnect hole 3 is not aligned, when the interconnect hole 3 is offset to the left, that is, when the interconnect hole 3 is offset close to the first strip in the third direction, the interconnect hole 3 is in contact with the first strip of the second layer 2, for example, as shown in FIG. 6, the dashed box in FIG. 6 indicates the position of the interconnect hole 3 after the offset. The first layer 1, the interconnect hole 3 and the first strip can form a conductive path, denoted as a left path; when the interconnect hole 3 is offset to the right, that is, the interconnect hole 3 is offset close to the third strip in the third direction, the interconnect hole 3 is in contact with the third strip of the second layer 2, for example, as shown in FIG. 7, the dashed box in FIG. 7 indicates the position of the interconnect hole 3 after the offset. The first layer 1, the interconnect hole 3 and the third strip can form a conductive path, denoted as a right path; when the interconnect hole 3 is offset forward, that is, the interconnect hole 3 is offset close to the second half strip in the second direction, the interconnect hole 3 is in contact with the second half strip of the second layer 2, for example, as shown in FIG. 9, the dashed box in FIG. 9 indicates the position of the interconnect hole 3 after the offset. The first layer 1, the interconnect hole 3 and the second half strip can form a conductive path, denoted as a front path; when the interconnect hole 3 is offset backward, that is, the interconnect hole 3 is offset close to the first half strip in the second direction, the interconnect hole 3 is in contact with the first half strip of the second layer 2, for example, as shown in FIG. 8, the dashed box in FIG. 8 indicates the position of the interconnect hole 3 after the offset. The first layer 1, the interconnect hole 3 and the first half strip can form a conductive path, denoted as a back path.

When the electrical test structure is used to detect the alignment of the interconnect hole 3, as long as one of the left, right, front or back paths is formed, the current in the first layer 1 will increase significantly. Therefore, the alignment of the interconnect hole 3 can be monitored by detecting the magnitude of the current in the first layer 1. The electrical test structure is simple in structure, easy to operate during testing, and reliable in result, and can quickly determine whether the interconnect hole 3 is aligned.

In an exemplary embodiment, an electrical test structure is provided. Referring to FIGS. 1 to 3, the electrical test structure may further include a first pad 4 and a second pad 5. The first pad 4 is, for example, PAD1 in FIG. 1, and the second pad 5 is, for example, PAD2 in FIG. 1. The first pad 4 is electrically connected to the first layer 1, and the second pad 5 is electrically connected to the second layer 2.

When the alignment of the interconnect hole 3 is detected, the first pad 4 may be electrically connected to a detection power source, and the second pad 5 may be grounded.

In the electrical test structure, the detection power supply applies a voltage to the first layer 1 through the first pad 4, and the second layer 2 is grounded through the second pad 5 to facilitate electrical test.

When the interconnect hole 3 is aligned, since the interconnect hole 3 is spaced apart from the second layer 2, no conductive path is formed in the first layer 1, the interconnect hole 3 and the second layer 2, and the current in the first layer 1 is zero. When the interconnect hole 3 is not aligned, since the interconnect hole 3 is in contact with the first strip, the third strip, the first half strip or the second half strip of the second layer 2, the first layer 1, the interconnect hole 3 and the second layer 2 form a conductive path, and the current in the first layer 1 is not zero. As such, the alignment of the interconnect hole 3 can be determined based on the current in the first layer 1, so the operation is simple and the result is reliable.

It should be noted that, when the electrical test structure is used to monitor the alignment of the interconnect hole 3, it can also be determined based on the current of other structures whether the first layer 1, the interconnect hole 3 and the second layer 2 form a conductive path, and then the alignment of the interconnect hole 3 is determined. For example, the current of the first pad 4, the current of the interconnect hole 3, the current of the second layer 2, the current of the second pad 5, etc. can be detected.

In addition, the second pad 5 may not be grounded, as long as the first pad 4, the first layer 1, the interconnect hole 3, the second layer 2 and the second pad 5 can form a conductive path when the interconnect hole 3 is in contact with the second layer 2. For example, the second pad 5 may be electrically connected to the first pad 4.

In an exemplary embodiment, a semiconductor structure is provided. The semiconductor structure may be DDR (the full name of DDR is DDR SDRAM (Double Data Rate SDRAM (synchronous dynamic random-access memory)), that is, double rate synchronous dynamic random access memory) or other memory structure (DRAM), and the other memory structure is, for example, a synchronous dynamic random-access memory (SDRAM).

Referring to FIGS. 1 to 3, the semiconductor structure may include a substrate 30, an oxide layer 20, and the first layer 1, the second layer 2 and the interconnect hole 3 of the electrical test structure as described above, and the second layer 2 is located inside the oxide layer 20. In the first direction, the substrate 30 is located on the side of the oxide layer 20 away from the first layer 1.

For example, referring to FIGS. 2 and 3, the first layer 1 is located on the upper side of the oxide layer 20, and the substrate 30 is located on the lower side of the oxide layer 20.

In this semiconductor structure, the alignment of the interconnect hole 3 can be determined by detecting whether the first layer 1, the interconnect hole 3 and the second layer 2 form a circuit path. For example, a voltage may be applied to the first layer 1, the second layer 2 may be grounded, and then the current of the first layer 1 is detected. If the current of the first layer 1 is zero, it indicates that the first layer 1, the interconnect hole 3 and the second layer 2 do not form a conductive path, and the interconnect hole 3 is aligned; if the current of the first layer 1 is not zero, it indicates that the first layer 1, the interconnect hole 3 and the second layer 2 form a conductive path, and the interconnect hole 3 is not aligned.

The semiconductor structure is simple and easy to manufacture, the method for detecting the alignment of the interconnect hole is also easy to operate, and the detection result is reliable.

In an exemplary embodiment, an electrical test method is provided. The electrical test method is applied to the electrical test structure as described above, wherein the second layer of the electrical test structure is grounded.

Figure 10:
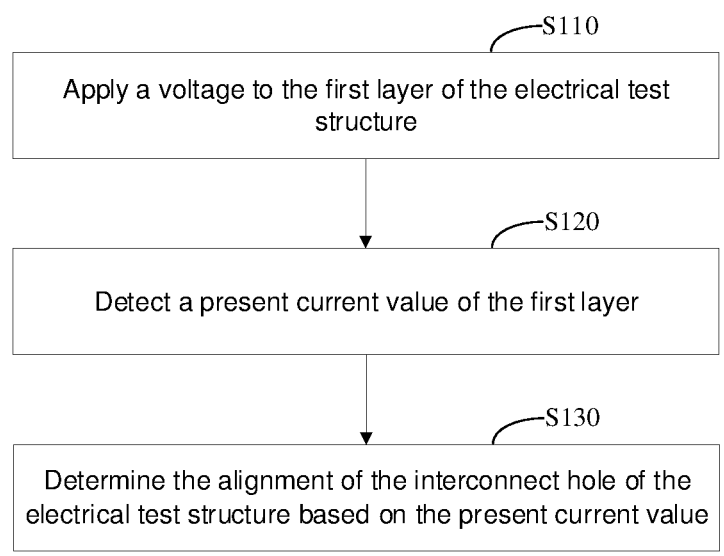
FIG. 10 is a flowchart of an electrical test method according to an example.

Referring to FIG. 10, the electrical test method may include:

S110, applying a voltage to the first layer of the electrical test structure;

S120, detecting a present current value of the first layer;

S130, determining the alignment of the interconnect hole of the electrical test structure based on the present current value.

In step S110, referring to FIG. 1, the first layer 1 may be electrically connected to the first pad 4, and the voltage is applied to the first layer 1 through the first pad 4. The voltage may be an alternating current voltage or a direct current voltage.

In step S120, referring to FIGS. 1 to 3, when the first layer 1, the interconnect hole 3 and the second layer 2 form a conductive path, the first layer 1, the interconnect hole 3 and the second layer 2 are connected in series, so the current should be the same everywhere. When the present current value of the first layer 1 is detected, the detection position may be any position in the conductive path.

In step S130, after the present current value is detected, the alignment of the interconnect hole of the electrical test structure can be determined based on the present current value.

If the present current value is less than or equal to a preset current value, it indicates that the first layer, the interconnect hole and the second layer do not form a conductive path, and the interconnect hole is aligned. If the present current value is greater than the preset current value, it indicates that the first layer, the interconnect hole and the second layer form a conductive path, and the interconnect hole is not aligned.

Referring to FIGS. 1 and 6 to 9, when the interconnect hole 3 is aligned, for example, the interconnect hole 3 is located at the position of the solid box in FIGS. 6 to 9, that is, the position shown by the interconnect hole 3, the interconnect hole 3 is not in contact with the test part 21, the first layer 1, the interconnect hole 3 and the second layer 2 cannot form a conductive path, and the present current value should be zero; when the interconnect hole 3 is not aligned, for example, when the interconnect hole 3 is located at the position of the dashed box in FIGS. 6 to 9, the present current value is not zero. Therefore, the preset current value may be zero. At this time, if the present current value is zero, it indicates that the first layer 1, the interconnect hole 3 and the second layer 2 do not form a conductive path, and the interconnect hole is aligned. If the present current value is not zero, it indicates that the first layer 1, the interconnect hole 3 and the second layer 2 form a conductive path, and the interconnect hole is not aligned.

In addition, when the resistances of the first test unit, the third test unit, the first half unit and the second half unit of the electrical test structure are different, the specific offset direction of the interconnect hole may also be determined based on the specific magnitude of the present current value, so as to learn the alignment of the interconnect hole more accurately.

The electrical test method can detect the alignment of the interconnect hole well and is easy to operate, the method for determining the alignment of the interconnect hole is simple, the detection result is highly reliable, and the method can improve the product yield and manufacturing efficiency of the semiconductor structure well.

The embodiments in this specification are described in a progressive manner, each embodiment focuses on the differences from other embodiments, and the same or similar parts between the various embodiments may be referred to each other.

In the description of this specification, the descriptions with reference to the terms "embodiment", "exemplary embodiment", "some embodiments", "schematic embodiment", "example", etc. mean that specific features, structures, materials or characteristics described in conjunction with the embodiments or examples are included in at least one embodiment or example of the present application.

In this specification, the schematic descriptions of the above terms do not necessarily refer to the same embodiment or example. Moreover, the described specific features, structures, materials or characteristics may be combined in an appropriate manner in any one or more embodiments or examples.

In the description of the present disclosure, it should be noted that the orientations or positional relationships indicated by the terms "center", "upper", "lower", "left", "right", "vertical", "horizontal", "inner", "outer", etc. are based on the orientations or positional relationships shown in the accompanying drawings, and are intended to facilitate the description of the present disclosure and simplify the description only, rather than indicating or implying that the device or element referred to must have a particular orientation or be constructed and operated in a particular orientation, and will not to be interpreted as limiting the present disclosure.

It can be understood that the terms "first", "second", etc. used in the present disclosure can be used in the present disclosure to describe various structures, but these structures are not limited by these terms. These terms are only used to distinguish the first structure from another structure.

In one or more drawings, the same elements are represented by similar reference numerals. For the sake of clarity, various parts in the drawings are not drawn to scale. In addition, some well-known parts may not be shown. For the sake of brevity, the structure obtained after several steps can be described in one figure. Many specific details of the present disclosure are described below, such as the structure, material, dimension, treatment process and technology of devices, in order to understand the present disclosure more clearly. However, as those skilled in the art can understand, the present disclosure may not be implemented according to these specific details.

Finally, it should be noted that the above embodiments are merely used to describe, but not to limit, the technical solutions of the present disclosure. Although the present disclosure is described in detail with reference to the above embodiments, those of ordinary skill in the art should understand that various modifications may be made to the technical solutions described in the foregoing embodiments, or equivalent substitutions may be made to some or all technical features thereof, and these modifications or substitutions do not make the essences of the corresponding technical solutions depart from the scope of the technical solutions of the embodiments of the present disclosure.

INDUSTRIAL APPLICABILITY

In the electrical test structure, semiconductor structure and electrical test method provided by the embodiments of the present disclosure, when the offset distances of the interconnect hole relative to the preset position in the second direction and the third direction are relatively short, it indicates that the interconnect hole is aligned and the interconnect hole is spaced apart from the test part; when the offset distances of the interconnect hole relative to the preset position in the second direction and/or the third direction are relatively long, it indicates that the interconnect hole is not aligned and the interconnect hole is in contact with the test part; as such, the alignment of the interconnect hole can be determined by detecting whether the first layer, the interconnect hole and the second layer form a circuit path. The electrical test structure has a simple structure, the method for detecting the alignment of the interconnect hole is easy to operate, and the detection result is reliable.

The invention claimed is:

1. An electrical test structure for a semiconductor structure, wherein in a first direction, the electrical test structure comprises a first layer, an interconnect hole and a second layer arranged in a stack, the interconnect hole is located between the first layer and the second layer, and the interconnect hole is in contact with the first layer;
the second layer comprises a body part and a test part, and the test part is connected to the body part;
the interconnect hole is configured as,
when an offset distance of the interconnect hole in a second direction and relative to a preset position is less than a first preset distance, or an offset distance of the interconnect hole in a third direction and relative to the preset position is less than a second preset distance, the interconnect hole is spaced apart from the test part;
when at least one of the offset distance of the interconnect hole in the second direction and relative to the preset position is greater than or equal to the first preset distance or the offset distance of the interconnect hole in the third direction and relative to the preset position is greater than or equal to the second preset distance, the interconnect hole is in contact with the test part;
the preset position is fixed relative to the second layer, and the first direction, the second direction and the third direction are perpendicular to each other; wherein
the test part comprises a first test unit, a second test unit and a third test unit connected to the body part, wherein the second test unit comprises a first half unit and a second half unit; and
a resistance of the first test unit, a resistance of the third test unit, a resistance of the first half unit and a resistance of the second half unit are all different from each other.

2. The electrical test structure according to claim 1, wherein the interconnect hole is constructed as a rectangular parallelepiped, and in the first direction, a size of the interconnect hole is equal to a spacing size between the first layer and the second layer.

3. The electrical test structure according to claim 1, wherein the first test unit and the third test unit extend in the second direction;
in the third direction, the first test unit and the third test unit are spaced apart, and the interconnect hole is located between the first test unit and the third test unit;
the interconnect hole is configured as,
when the offset distance of the interconnect hole in the third direction and relative to the preset position is less than the second preset distance, the interconnect hole is spaced apart from the first test unit and the third test unit;
when the offset distance of the interconnect hole in the third direction and relative to the preset position is greater than or equal to the second preset distance, the interconnect hole is in contact with the first test unit, or the interconnect hole is in contact with the third test unit.

4. The electrical test structure according to claim 3, wherein the interconnect hole is constructed as a rectangular parallelepiped, and in the third direction, a size of the interconnect hole is equal to a spacing size between the first test unit and the third test unit.

5. The electrical test structure according to claim 3, wherein at least one of shapes or sizes of the first test unit and the third test unit are the same.

6. The electrical test structure according to claim 3, wherein the second test unit extends in the second direction;
in the third direction, the second test unit is located between the first test unit and the third test unit, and a spacing size between the first test unit and the second test unit is equal to a spacing size between the second test unit and the third test unit.

7. The electrical test structure according to claim 6, wherein;
in the second direction, the first half unit and the second half unit are spaced apart, and the interconnect hole is located between the first half unit and the second half unit;
the interconnect hole is configured as,
when the offset distance of the interconnect hole in the second direction and relative to the preset position is less than the first preset distance, the interconnect hole is spaced apart from the first half unit, and the interconnect hole is spaced apart from the second half unit;
when the offset distance of the interconnect hole in the second direction and relative to the preset position is greater than or equal to the first preset distance, the interconnect hole is in contact with the first half unit, or the interconnect hole is in contact with the second half unit.

8. The electrical test structure according to claim 7, wherein the interconnect hole is constructed as a rectangular parallelepiped, and in the second direction, a size of the interconnect hole is equal to a spacing size between the first half unit and the second half unit.

9. The electrical test structure according to claim 7, wherein at least one of shapes or sizes of the first half unit and the second half unit are the same.

10. The electrical test structure according to claim 7, wherein the second layer further comprises a support unit, the interconnect hole is located between the first layer and the support unit, and the support unit is in contact with the interconnect hole;
in the second direction, the support unit is located between the first half unit and the second half unit.

11. The electrical test structure according to claim 10, wherein the preset position is a position where the interconnect hole is located when a line connecting a geometric center of the interconnect hole with a geometric center of the support unit extends in the first direction.

12. The electrical test structure according to claim 1, further comprising a first pad and a second pad, wherein the first pad is electrically connected to the first layer, the second pad is electrically connected to the second layer, the first pad is electrically connected to a detection power source, and the second pad is grounded.

13. The semiconductor structure, comprising an oxide layer, and the first layer, the second layer and the interconnect hole of the electrical test structure according to claim 1, wherein the second layer is located inside the oxide layer.

14. An electrical test method, applied to the electrical test structure according to claim 1, the second layer of the electrical test structure being grounded, the electrical test method comprising:
   applying a voltage to the first layer of the electrical test structure;
   detecting a present current value of the first layer;
   determining alignment of the interconnect hole of the electrical test structure based on the present current value; and
   when the interconnect hole is not aligned, determining a specific structure in the second layer and in contact with the interconnect hole based on the present current value, the resistance of the first test unit, the resistance of the third test unit, the resistance of the first half unit and the resistance of the second half unit.

15. The electrical test method according to claim 14, wherein determining, based on the present current value, whether the interconnect hole is aligned comprises:
   when the present current value is greater than a preset current value, determining that the interconnect hole is not aligned.

* * * * *